United States Patent [19]
Florio et al.

[11] Patent Number: 5,858,198
[45] Date of Patent: *Jan. 12, 1999

[54] ELECTROPLATING PROCESS

[75] Inventors: Steven M. Florio, Hopkinton; Jeffrey P. Burress, Milford; Carl J. Colangelo, New Bedford; Edward C. Couble, Brockton; Mark J. Kapeckas, Worcester, all of Mass.

[73] Assignee: Shipley Company, L.L.C., Marlborough, Mass.

[*] Notice: The term of this patent shall not extend beyond the expiration date of Pat. No. 5,738,776.

[21] Appl. No.: 924,929

[22] Filed: Sep. 8, 1997

Related U.S. Application Data

[63] Continuation of Ser. No. 588,745, Jan. 19, 1996, Pat. No. 5,738,776.

[51] Int. Cl.⁶ .............................. C23C 28/00; C25D 5/02; C25D 5/54; C25D 5/48
[52] U.S. Cl. ........................... 205/183; 205/122; 205/125; 205/163; 205/166; 205/220; 205/223; 205/917
[58] Field of Search ..................................... 205/118, 122, 205/125, 163, 166, 220, 223, 917, 183

[56] References Cited

U.S. PATENT DOCUMENTS

| | | | |
|---|---|---|---|
| 2,897,409 | 10/1959 | Gitto | 106/176 |
| 4,512,818 | 4/1985 | Valayil et al. | 148/614 R |
| 4,619,741 | 10/1986 | Minten et al. | 204/15 |
| 5,328,561 | 7/1994 | Letize et al. | 156/666 |
| 5,358,602 | 10/1994 | Sutcliffe et al. | 156/656 |
| 5,374,346 | 12/1994 | Bladon et al. | 205/125 |
| 5,389,270 | 2/1995 | Thorn et al. | 252/22 |
| 5,618,400 | 4/1997 | Florio et al. | 205/98 |
| 5,690,805 | 11/1997 | Thorn et al. | 205/118 |

*Primary Examiner*—Kathryn Gorgos
*Assistant Examiner*—Edna Wang
*Attorney, Agent, or Firm*—Robert L. Goldberg; Peter F. Corless; Darryl P. Frickey

[57] ABSTRACT

A process for electroplating a metal clad substrate by coating the substrate with a coating of carbonaceous particles. The coating of particles is applied to the substrate from an aqueous dispersion and then the coating is saturated with an etchant for the metal cladding on the substrate to undercut the carbonaceous coating and facilitate its removal from areas where plating is undesired.

14 Claims, 1 Drawing Sheet

ELECTROPLATING PROCESS

This is a continuation of application Ser. No. 08/588,745 filed on Jan. 19, 1996 now U.S. Pat. No. 5,738,776.

BACKGROUND OF THE INVENTION

1. Introduction

This invention relates to a process for electroplating substrates having metallic and non-metallic regions. More particularly, this invention relates to a step of metal plating during printed circuit board manufacture where a copper clad non-conducting substrate is provided with openings for electrical connections and coated with a carbonaceous conductive coating which is subsequently removed from those portions of the substrate where plating is undesired. More particularly, this invention relates to an improved means for electroplating using carbonaceous coatings with improved means for removal of the carbonaceous coating from surfaces where plating is undesired.

2. Description of the Prior Art

Nonconductor surfaces are conventionally metallized by a sequence of steps comprising catalysis of the surface of the nonconductor to render the same catalytic to electroless metal deposition followed by contact of the catalyzed surface with an electroless plating solution that deposits metal over the catalyzed surface in the absence of an external source of electricity. Metal plating continues for a time sufficient to form a metal deposit of desired thickness. Following electroless metal deposition, the electroless metal deposit is optionally enhanced by electrodeposition of metal over the electroless metal coating to a desired thickness. Electrolytic deposition is possible because the electroless metal deposit serves as a conductive coating that permits electroplating.

Catalyst compositions useful for electroless metal plating are known in the art and disclosed in numerous publications including U.S. Pat. No. 3,011,920, incorporated herein by reference. The catalyst of this patent consists of an aqueous suspension of a tin—noble catalytic metal colloid. Surfaces treated with such catalysts promote the generation of electrolessly formed metal deposits by the oxidation of a reducing agent in an electroless plating solution catalyzed by the catalytic colloid.

Electroless plating solutions are aqueous solutions containing both a dissolved metal and a reducing agent in solution. The presence of the dissolved metal and reducing agent together in solution results in plate out of the metal in contact with a catalytic metal tin catalyst. However, the presence of the dissolved metal and reducing agent together in solution may also result in solution instability and indiscriminate deposition of metal on the walls of containers for such plating solutions. This may necessitate interruption of the plating operation, removal of the plating solution from the tank and cleaning of tank walls and bottoms by means of an etching operation. Indiscriminate deposition may be avoided by careful control of the plating solution during use and by use of stabilizers in solution which inhibit indiscriminate deposition, but which also retard plating rate.

Attempts have been made in the past to avoid the use of an electroless plating solution by a "direct plate process" whereby a metal may be deposited directly over a treated nonconductive surface. One such process is disclosed in U.S. Pat. No. 3,099,608, incorporated herein by reference. The process disclosed in this patent involves treatment of the nonconductive surface with a tin-palladium colloid which forms an essentially nonconductive film of colloidal palladium particles over the nonconductive surface. This is the same tin-palladium colloid used as a plating catalyst for electroless metal deposition. For reasons not fully understood, it is possible to electroplate directly over the catalyzed surface of the nonconductor from an electroplating solution though deposition occurs by propagation and growth from a conductive surface. Therefore, deposition begins at the interface of a conductive surface and the catalyzed nonconductive surface. The deposit grows epitaxially along the catalyzed surface from this interface. For this reason, metal deposition onto the substrate using this process is slow. Moreover, deposit thickness is uneven with the thickest deposit occurring at the interface with the conductive surface and the thinnest deposit occurring at a point most remote from the interface.

An improvement in the process of U.S. Pat. No. 3,099,608 is described in U.K Patent No. 2,123,036 B, incorporated herein by reference. In accordance with the process described in this patent, following catalysis, a surface is electroplated from an electroplating solution containing an additive that is said to inhibit deposition of metal on the metal surface formed by plating without inhibiting deposition on the metallic sites over the nonconductive surface. In this way, there is said to be preferential deposition over the metallic sites with a concomitant increase in the overall plating rate. In accordance with the patent, the metallic sites are preferably formed in the same manner as in the aforesaid U.S. Pat. No. 3,099,608- i.e., by immersion of the nonconductive surface in a solution of a tin-palladium colloid. The additive in the electroplating solution responsible for inhibiting deposition is described as one selected from a group of dyes, surfactants, chelating agents, brighteners, and leveling agents. Many of such materials are conventional additives for electroplating solutions.

There are limitations to the above process. Both the processes of the U.S. and U.K. patents for electroplating require conductive surfaces for initiation and propagation of the electroplated metal deposit. For this reason, the processes are limited in their application to metal plating solutions of nonconductive substrates in areas in close proximity to a conductive surface. In addition, in practice, it has been found that the surface provided with metallic sites is not robust and does not stand up to those chemical treatment compositions used prior to the step of electroplating. For this reason, when the process is used for the manufacture of printed circuit boards, void formation is a significant problem resulting in rejection of circuit boards manufactured by the process.

Improvements in processes for direct electroplating of nonconductors that overcome the deficiencies in the processes of U.S. Pat. No. 3,099,608 and in U.K. Patent No. 2,123,036 are disclosed in U.S. Pat. Nos. 4,895,739; 4,919,768; 4,952,286; and 5,276,290, each incorporated herein by reference. In accordance with the processes of these patents, an electroless plating catalyst, such as that disclosed in the aforesaid U.K. patent, is treated with an aqueous solution of a chalcogen, such as a sulfur solution, to convert the catalyst surface to a chalcogenide surface. By conversion of the surface to the chalcogenide conversion coating, the coating formed is both more robust and more conductive and electroless plating catalyst does not desorb from the surface during metallization. Consequently, in accordance with the process of said patents, it is possible to form printed circuit boards using formulations that would otherwise attack the catalyst layer such as those solutions used in patterned plating processes.

The processes of the aforementioned patents provide a substantial improvement over the process of the U.K. Patent.

However, it has also been found that treatment of an adsorbed catalytic metal on a substrate having both nonconductive portions and metallic portions, such as a printed circuit board substrate, with a sulfide solution results in a formation of a sulfide on metal surfaces in contact with the solution of the sulfide precursor solution. Therefore, if the process is used in the manufacture of printed circuit boards, both the catalytic metal and the copper cladding or conductors of the printed circuit board base material are converted to a tenaciously adherent sulfide. If the copper sulfide is not removed prior to electroplating, it may reduce the bond strength between the copper and a subsequently deposited metal over the copper.

An alternative method for direct electroplating of nonconductors is disclosed in U.S. Pat. No. 4,619,741, incorporated herein by reference. In accordance with the procedures of this patent, a nonconductive substrate is coated with a dispersion of carbon black and then dried. The coating is removed from surfaces where plating is undesired and the remaining portions of the substrate are plated using procedures similar to those described in the aforesaid references. There are several problems inherent in this procedure. For example, carbon black is a poor conductor of electricity and consequently, before forming the carbon black dispersion, in practice, it is believed that the carbon black particles must be treated with an organic ionomer or polymer to enhance conductivity. In addition, during processing, and prior to electroplating, the carbon black dispersion is only poorly adhered to the underlying substrate and has a tendency to flake off of the substrate prior to the plating step. This results in void formation during plating. In addition, because of the poor adherence to the substrate, subsequent to plating, there is a tendency for the metal deposit to separate from the substrate. This can lead to interconnect defects between a metallized hole and an innerlayer in multilayer printed circuit fabrication.

A more recently utilized direct plate process for metallizing the walls of hole-walls employs dispersions of graphite for the formation of a conductive coating. The use of graphite to form conductive coatings on through-hole walls is known and disclosed in U.S. Pat. No. 2,897,409 incorporated herein by reference. Current processes are disclosed, for example, in U.S. Pat. Nos. 4,619,741 and 5,389,270, each incorporated herein by reference. In accordance with the procedures set forth in these patents, a dispersion of carbon black or graphite is passed through the through-holes to form a coating of the dispersion on the hole-walls. The coating is "fixed" by baking the coating to dryness to yield a conductive layer of the carbon black or graphite which is sufficiently conductive for electroplating in a conventional manner.

In the above process, because carbon and graphite are less conductive than metal and the coatings formed using dispersions of these materials are relatively porous, it is necessary to deposit a relatively thick layer of the dispersion on the substrate to provide adequate conductivity for electrolytic deposition. To increase the thickness of the coating on a substrate, a typical pretreatment procedure involves contact of a substrate with a polyelectrolyte which is a material having surfactant properties that causes the polyelectrolyte to bond to nonconducting surfaces with a tail extending outward having a charged end opposite the charge of the dispersed particles within the dispersion. This increases adsorption of the particles onto the surface of the substrate when the substrate is immersed in the dispersion thereby increasing the thickness of the deposit. A difficulty with the process is that the polyelectrolyte also adsorbs onto copper surfaces resulting in formation of a heavy deposit of the carbonaceous particles on all exposed copper surfaces. This carbonaceous coating on the copper must be removed prior to electrolytic deposition. Otherwise, the coating will interfere with the bond strength between the copper surface of the substrate and a subsequently deposited electrolytic metal deposit. In addition, excess of the carbonaceous coating must be removed from the holes passing through the substrate to prevent blockage of the same during plating. This problem is exacerbated when carbon aggregates are contained in the dispersion as a consequence of an inadequate concentration of a dispersing agent.

The conventional method for removing a carbon coating from copper surfaces involves etching of the copper to undercut the carbon coating. Following etching, the substrate is rinsed by contact with pressurized water to remove the coating from the copper surfaces and to remove aggregates from the hole interiors. These steps are laborious and often disrupt the carbonaceous coating on the nonconducting surfaces to be electrolytically plated resulting in plating defects.

SUMMARY OF THE INVENTION

The present invention is directed to an improved process for the direct electroplating of a planar substrate having openings passing therethrough, such as a printed circuit board substrate, using a dispersion of carbon black or graphite particles, hereinafter referred to collectively as a carbonaceous coating or a carbonaceous dispersion.

In accordance with the invention, following coating of the substrate to be plated with the carbonaceous dispersion, means are provided to facilitate removal of the carbonaceous coating from copper clad surfaces where metal plating is undesired and for removal of entrapped aggregates from openings passing through the circuit board substrate. In accordance with the invention, following formation of the carbonaceous coating over the surfaces of the circuit board substrate using conventional procedures, the so formed carbonaceous coating is contacted with a solution of an etchant for the metal portion of the substrate underlying the carbonaceous coating for a time sufficient to fill all of the pores within the carbonaceous coating with the etchant. Thereafter, the substrate is again contacted with the etchant by spraying the etchant against the substrate surface at a spray pressure of at least 15 pounds per square inch to remove the carbonaceous coating from the underlying metal surfaces and to remove entrapped aggregates of the carbonaceous coating from the interior of holes passing through the substrate.

The purpose of first filling the pores within the carbonaceous coating with the etchant is to provide dwell time for the etchant to dissolve the underlying metal and undercut the carbonaceous coating. The etchant spray at the minimum pressure described above removes the carbonaceous coating from the metal surfaces and causes turbulent flow of the etchant through the openings thereby removing entrapped aggregates within the openings.

DESCRIPTION OF THE PREFERRED EMBODIMENTS

The subject invention is suitable for the manufacture of a variety of commercial articles where a metal deposit is desired over a surface of a planar substrate having metallic and non-metallic regions and non-metallic regions. However, as described above, the invention is especially useful for fabrication of printed circuit boards having copper cladding over at least one surface of a printed circuit board substrate. For this reason, the description that follows is directed primarily to printed circuit board manufacture.

Figure 1:
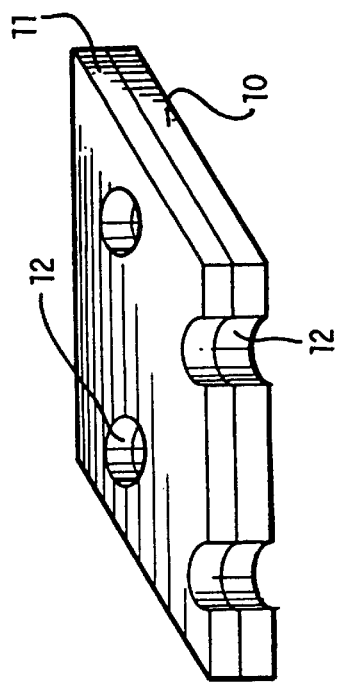
FIG. 1 is a pictorial representation of a printed circuit board substrate.

In printed circuit board manufacture, the substrate most commonly used is an epoxy substrate filled with glass fibers and copper clad on at least one of its surfaces, or an innerlayer clad with copper, as used for multilayer circuit fabrication. As is known in the art, the epoxy can be substituted or mixed with other resins for specific purposes. FIG. 1 of the drawings illustrates a substrate suitable for treatment in accordance with the invention. The substrate shown is a simplified, cut-away pictorial representation of a printed circuit board base material comprising an insulating substrate 10 coated with copper cladding 11 and having openings 12 passing through its entire thickness. These openings are small, typically having a diameter of 1 mil or less.

In the manufacture of a double-sided printed circuit board using a carbonaceous dispersion, a first step comprises formation of the through-holes by drilling or punching or any other method known to the art. Following formation of the holes, it is desirable to employ the conventional steps of rinsing with an organic solution to clean and degrease the board. This is followed by desmearing the hole walls with sulfuric acid, chromic acid, permanganate, or plasma etching. Following desmearing, the circuit board base material is conventionally treated with a glass etchant that removes glass fibers extending into the holes from the hole walls. This is followed by a solution that neutralizes acid residues. The hole walls are then treated to promote particle adsorption. Such treatment solutions are often referred to as conditioners and typically comprise an aqueous alkaline surfactant solution for cleaning soil and an amine to condition the hole walls. The material of choice for the step of conditioning is a polyelectrolyte. Polyelectrolytes are typically polymers having a plurality of charged groups along their chains where the charged groups carry a charge opposite from the charge of a dispersed particle to be adsorbed onto the substrate. Polyelectrolytes used in metal plating procedures are disclosed in numerous publications including U.K. Patent No. 1,338,491 and U.S. Pat. Nos. 4,478,883; 4,554,182; 4,701,350 and 4,969,979, each incorporated herein by reference. The step of treatment with the polyelectrolyte, by itself, is old in the art and does not constitute a part of the invention.

Following the pretreatment procedures described above, the next step in the conventional process comprises treating the substrate with a dispersion of carbonaceous particles. As aforesaid, the particles may be of carbon black (amorphous) or may be of graphite (crystalline), or a mixture of the two. The carbon may be present in the dispersion in an amount of from about 0.1 to about 20% by weight of the dispersion, and preferably in an amount of from about 0.5 to about 10% by weight of the dispersion. The carbon may have a mean particles size within a range of from about 0.05 to about 50 microns and typically is of a particle size within a range of from about 0.3 to 5.0 microns. From the perspective of performance, particles from the smaller end of the size range are preferred. Graphite particles of suitable size can be prepared by the wet grinding or milling of raw graphite having a particle size greater than 50 microns to form a slurry of smaller particles. Graphite particles of suitable size can also be formed by graphitizing already-small carbon-containing particles.

If both carbon black and graphite are used, the carbon black may have a substantially smaller particle size than the graphite. The ratio of graphite to carbon black may vary from about 1:100 to about 100:1, and preferably from about 1:10 to about 10:1.

The carbon black useful herein can be substantially as described in U.S. Pat. No. 5,139,642 incorporated herein by reference. Several commercial carbon blacks contemplated to be useful herein include CABOT MONARCH 1300, sold by Cabot Corporation, Boston, Mass.; CABOT XC-72R Conductive, from the same manufacturer; ACHESON ELECTRODAG 230, sold by Acheson Colloids Co., Port Huron, Mich.; COLUMBIAN RAVEN 3500, made by Columbian Carbon Co., New York City, N.Y.; and other conductive carbon blacks having similar particle sizes and dispersion characteristics.

The graphite useful herein can be substantially as described in U.S. Pat. No. 5,139,642 and may be either synthetic or naturally occurring. Suitable commercial graphites and graphite dispersions contemplated to be useful herein include: ULTRAFINE GRAPHITE, sold by Showa Denko K. K., Tokyo, Japan; AQUADAG E, sold by Acheson Chemical Company; MICRO 440, sold by Asbury Graphite Mills Inc., Asbury, N.J.; GRAPHITE 850, also sold by Asbury; GRAFO 1204B, sold by Metal Lubricants Company, Harvey, Ill.; GRAPHOKOTE 90, sold by Dixon Products, Lakehurst, N.J.; NIPPON AUP (0.7 micron), sold by Nippon Graphite Industries, Ltd., Ishiyama, Japan; and others having similar electrical and dispersion characteristics. Synthetic graphite is preferred. Synthetic graphite is formed by heat treating (graphitizing) a carbon source at temperatures exceeding 2400° C.

Another component of conventional carbonaceous dispersions used for the formation of conductive coatings in electroplating processes is a water soluble or dispersible binding agent to bind the carbon particles. The binding agent is believed to assist the dispersed carbon particles in adhering to the surface of the non-conductive (i.e., dielectric) substrate which is to be made conductive for electroplating. The binding agent may be present as from about 0% to about 15% by weight, and preferably from about 0.2 to about 10% by weight.

The binding agent is preferably a natural or synthetic polymer, polymerizable monomer, or other viscous or solid material (or precursor thereof) that is capable of both adhering to the carbon particles and of receiving an anionic dispersing agent (as described below). For example, the binding agent may be a water soluble or water dispersible material selected from the group consisting of mono- and polysaccharides (or, more broadly, carbohydrates and anionic polymers). Monosaccharide binding agents include tetroses, pentoses, and hexoses. Polysaccharide (including disaccharide and higher saccharides) binding agents contemplated for use herein include sucrose, maltose, fructose, lactose, stachyose, maltopentose, dextrin, cellulose, corn starch, other starches, and polysaccharide gums. Polysaccharide gums include agar, arabic, xanthan, pectin, alginate, tragacanath, dextran and other gums. Derivative polysaccharides include cellulose acetates, cellulose nitrates, methylcellulose, and carboxymethylcellulose. Hemi-cellulose polysaccharides include d-gluco-d-mannans, d-galacto-d-gluco-d-mannans, and others. Anionic polymers include the alkylcelluloses or carboxyalkylcelluloses, their low- and medium-viscosity alkali metal salts (e g. sodium carboxymethylcellulose, or "CMC"), cellulose ethers, and nitrocellulose.

The acrylics that may be used herein for use as binding agents include polymerizable monomers and polymers, for example, emulsion polymers commonly known as acrylic lattices. The monomers include acrylamide, acrylonitrile, acrylic acid, methacrylic acid, glycidyl methacrylate, and others. The acrylic polymers include polymers of any one or more of the foregoing monomers; polyacrylamide polymers; polyacrylic acid; acrylic ester polymers such as polymethyl acrylate, polyethyl acrylate, polypropyl acrylate, polyisopropyl acrylate, polybutyl acrylate, polyisobutyl acrylate, polypentyl acrylate, polyhexyl acrylate, polyheptyl acrylate, polyoctyl acrylate, and polyisobornyl acrylate; and other polyacrylates.

Other binding agents may also be used such as vinyl resins including polyvinyl acetates, polyvinyl ethers, polyvinyl chlorides; pyrrolidone resins such as poly(N-vinyl-2-pyrrolidone); polyols such as polyvinyl alcohols and other materials that may be used as binding agents including polyethylenimine, methylaminoethyl resins, alkyltrimethylammonium chlorides, and others. Esters of olefinic alcohols, aminoalkyl esters, esters of ether alcohols, cycloalkyl esters, and esters of halogenated alcohols.

A practical upper limit to the amount of binding agent used is that amount which materially interferes with the conductivity of the resulting conductive coating by diluting the conductive solids in the composition after it is deposited as a film.

As described above, another conventional component in a carbonaceous dispersion is an anionic dispersing agent. The anionic dispersing agent has a hydrophobic end and a hydrophilic end. It functions by surrounding the bound carbon particles and causing the bound particles to disperse. It is believed that the hydrophobic end of each anionic dispersing agent is attracted to the hydrophobic region of the binding agent, thereby causing the anionic end of the anionic dispersing agent to stick out into the aqueous surrounding dispersing medium. When each bound carbon particle has sufficient dispersing agent bound to it, the sphere of anionic charges surrounding each particle causes the particles to repel one another, and thus to disperse.

The amount of anionic dispersing agent used in the conventional system is an amount sufficient to cause the bound carbonaceous particles to disperse in the aqueous dispersing medium. The amount used is dependent upon the size of the carbonaceous particles and the amount of binding agent bound thereto. To determine the amount of dispersing agent that is required in any particular case, one of ordinary skill in the art begins by adding ever increasing amounts of dispersing agent to the bound carbonaceous particles until a sufficient amount is added to cause the particles to disperse. This amount of dispersing agent is the minimum effective amount of dispersing agent for the conventional systems utilizing the dispersing agent. Increasing amounts of dispersing agent may be added without adversely affecting the stability of the dispersion of the carbonaceous particles but, as described above, excess dispersing agents may cause voids. To ensure that the particles remain dispersed, it has been recommended that a 10 percent excess of the dispersing agent be added. For example, the anionic dispersing agent is generally present in an amount of from about 0.1% to about 5% by weight. In accordance with this invention, that amount may be decreased to the minimum effective amount as described herein.

Suitable anionic dispersing agents include acrylic lattices, aqueous solutions of alkali metal polyacrylates, and similar materials.

An optional component of the composition of the present invention is a surfactant used in combination with the dispersing agent. The function of the surfactant is to decrease the surface tension of the aqueous dispersing medium such that the aqueous dispersing medium containing the dispersed carbon particles is able to freely penetrate into the through holes. A second function of the surfactant is to wet the surfaces of the polymeric and glass substrates. This facilitates the coating of these surfaces with the carbon dispersion. The amount of surfactant that is used in any particular case will vary depending upon the surfactant itself. When used, the amount of the surfactant may vary from about 0.01% to about 10% by weight, and preferably in the amount of from about 0.02% to about 3% by weight.

Suitable surfactants for use in the present invention include TRITON X-100, sold by Rohm and Haas Co., Philadelphia, Pa.; FLUORAD® FC-120, FC-430, FC-431, FC-129, and FC-135 anionic fluorochemical surfactant; sold by Minnesota Mining & Manufacturing Co., St. Paul, Minn.; DARVAN NO. 1, sold by R. T. Vanderbilt Co.; ECCOWET LF, sold by Eastern Color and Chemical; PETRO ULF, sold by Petro Chemical Co. Inc.; POLYTERGENT B-SERIES surfactant, sold by Olin Corporation; and others.

The dispersion is used over a wide pH range such as from about 3.0 to 13.0, but preferably has a pH of from about 8 to 13.0 and more preferably, a pH within the range of 8.5 to 12. The pH may be maintained by a pH buffer. The buffer functions by precluding or minimizing changes in pH such as may occur during the course of a run as a large number of boards are treated with the composition of the present invention. The maintenance of a constant or nearly constant pH insures the composition is reproducible from board to board.

Another useful additive to the dispersion is a copper etchant or complexing agent compatible at the pH of the carbonaceous dispersion. This additive is used to etch copper cladding simultaneously with the formation of the carbonaceous coating and, combined with the steps described below, ensures ready removal of carbonaceous coating from the copper surfaces. Copper etchants and complexing agents suitable for use within the useful pH range are known in the art and disclosed in numerous publications. A preferred class of materials are those materials used as complexing agents in electroless copper plating solutions. Such materials are disclosed in numerous prior publications including U.S. Pat. Nos. 3,728,137 and 3,790,392 incorporated herein by reference. Such materials include, by way of example, Rochelle salts, the sodium salts of ethylenediamine tetraacetic acid, nitrilotriacetic acid and its alkali metal salts, triethanolamine, modified ethylenediamine tetraacetic acids such as N-hydroxyethylene diamine triacetate, hydroxyalkyl substituted dialkaline triamines such as pentahydroxypropyldiethylenetriamine and the like. One preferred class of amines are the hydroxyalkyl substituted tertiary amines such as tetrahydroxypropylethylene diamine, pentahydroxypropyl diethylene triamine, trihydroxypropyl amine, trihydroxypropyl hydroxyethylethylene diamine and the like. Another suitable class of materials are those materials used as relatively mild copper etchants, especially the amine based etchants. Such etchants are known in the art and disclosed in numerous publications including U.S. Pat. Nos. 3,837,945 and 4,280,887, incorporated herein by reference. Such materials include, by way of example, ammonia and ammonium salts such as tetraamine cupric and cuprous salts and ammoniacal peroxy compounds as disclosed in the aforesaid patents. Aggressive etchants such as ferric chloride and chromic/sulfuric etchants are generally undesired for purposes of this invention. Preferably, the material used to add to the dispersant is one that is capable of complexing with the copper cladding to theoretically remove only the top monolayer of the copper cladding. However, for purposes of the invention, the dissolution agent is one that should be of a strength sufficient to etch from about 1 to 100 microinches of copper and preferably, from 5 to 25 microinches of copper during that period of time that the carbonaceous coating material is in contact with the copper. Obviously, in addition to the selection of the dissolution agent, the depth of penetration of the dissolution agent is controlled by pH and concentration. A preferred etchant is ammonium hydroxide as ammonium hydroxide provides adequate removal of copper ions from the surface of the cladding and may be used for close pH control.

The etchant is added to the dispersion in an amount sufficient to etch copper as described above. Preferably, the etchant is used in an amount of from about 0.1 to 10 percent by weight of the dispersion and more preferably, in an amount of from 0.5 to 5 percent by weight of the dispersion. The method of adding the amine is by simple mixing and does not constitute a part of this invention.

A final component of the composition is an aqueous dispersing medium. The phrase "aqueous dispersing medium," as used herein, includes any solvent that is from 80 to 100% water wherein the balance of the material is a water soluble organic composition. Typical water soluble organic compositions include the low molecular weight alcohols, such as methanol, ethanol, and isopropanol. Additional organic components include solvents such as dimethylsulfoxide, tetrahydrofuran, and ethylene or propylene glycol. Preferably, the aqueous dispersing medium is 100% water.

The carbonaceous coating is applied to a planar substrate in a conventional manner, typically by immersion into a treatment tank filled with the dispersion. In one preferred embodiment of the invention, the carbonaceous dispersion is free of dispersing agent and physical means are used to continuously redisperse the particles and maintain the dispersion homogenous during treatment of a substrate. The preferred physical means is a shear pump, also known in the art as a colloid mill, with a portion of the dispersion circulated from the treatment tank holding the dispersion, preferably from the top thereof, in a closed loop back to the treatment tank, preferably to the bottom thereof, by means of a shear pump capable of homogeneously dispersing the carbonaceous particles within the dispersion. In use, the dispersion is fed form the treatment tank through the closed loop containing the shear pump under pressure.

Within the shear pump, the dispersion comes into contact with a rapidly spinning rotor. The rotor is set very closely and precisely within a matching stationary stator which creates a gap between the rotor and the stator. The distance between the two, the gap, is adjusted to a distance of from 0.001 to 0.125 inches and preferably, about 0.020 inches. This space is referred to as the grinding gap. As the dispersion comes into contact with the rotor, it is flung to the edge thereof by centrifugal force. This forces pushes the dispersion down through the narrow grinding gap between the rotor and stator. Particles, while whirling around in the film on the rotor, are subjected to a many eddy currents of tremendous force. This force imparts high shear to the product which overcomes the surface forces tending to hold the particles together. The product passes through the shear zone and is forced out into an open area. At this point, it passes out of the shear pump through a suitable opening and back into the closed loop described above for return to the treatment tank. Dependent upon the actual shear pump used, it may be necessary to used a conventional centrifugal pump in conjunction with the shear pump to maintain adequate flow rate.

It is known that shear pumps or colloid mills have rotors varying between about 1 and 8 inches. The rotor may rotate at a speed of from about 1,200 to 10,000 RPM dependent on the size of the rotor and the flow rate through the mill, the higher RPM being used with the smaller rotors and lower flow rates. In the preferred embodiment, a 1 to 4 inch rotor is preferred and used at a speed of from 3,000 to 9,000 RPM.

When using the shear pump or mill, the dispersion must be circulated through the pump at an adequate flow rate to ensure that the dispersion remains homogeneous during the step of coating the dispersion onto a substrate. The flow rate may be referred to in units of tank volume per unit time. Thus, one tank volume per hour would be the full volume of the dispersion in the treatment tank circulated through the closed loop during a period of one hour. In accordance with the invention, the flow rate of the dispersion through the closed loop would be at least two tank volumes per hour, preferably from 4 to 25 tank volumes per hour and most preferably, from 6 to 12 tank volumes per hour.

The use of a shear pump as described above is preferred as it provides a relatively homogenous dispersion that is stable for sufficient time without disturbing the dispersion within the treatment tank during the step of coating the dispersion on a substrate. Other methods may be used that are lesser preferred. For example, a conventional rotary pump may be used in place of the shear pump, but passing the dispersion through such a pump does not adequately disperse the particles within the dispersion nor provide a dispersion that is stable for a sufficiently long time. High speed agitators may be placed within the treatment tank to agitate the dispersion. However, the agitator disrupts the dispersion by forming air bubbles within the dispersion, by creating foam and also fails to adequately disperse the particles. Both air bubbles and foam may lead to the formation of voids and discontinuities in a metal deposit.

When using physical means to maintain the dispersion homogeneous, it is also advantageous to filter the dispersion to remove agglomerates. Therefore, a filter is preferably used in the closed loop through which the dispersion is passed downstream of the shear pump. The filter should have the ability to remove particles slightly larger than the mean particle with the dispersion. For graphite dispersions, a filter suitable of removing particles having a diameter greater than at least 200 microns and preferably greater than 50 microns is suitable.

Figure 2:
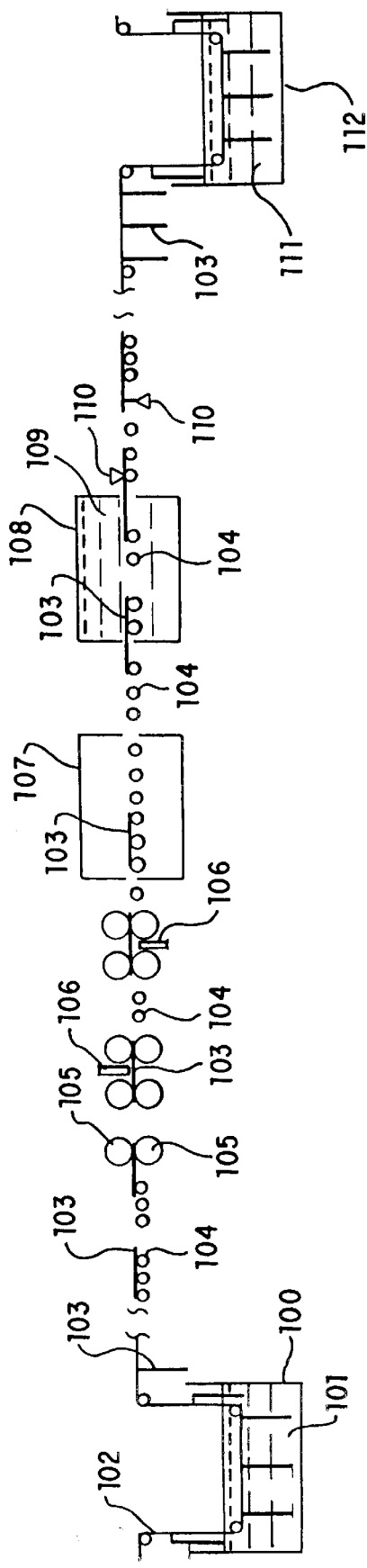
FIG. 2 is a schematic representation of a plating line in accordance with the invention.

A substrate to be plated in accordance with the invention would be pretreated in a conventional manner. Using the copper clad substrate having openings therein of FIG. 1 for purposes of illustration, the board would be cleaned, rinsed, treated with a conditioner that is preferably a polyelectrolyte conditioner and coated with the carbonaceous coating. This process is typically conducted on an automated plating line. Such a line is illustrated in FIG. 2 of the drawings. In FIG. 2, the stations for application of the carbonaceous coating, the processing of the carbonaceous coating in accordance with the invention, and the electroplating module are represented. For brevity, the stations required for pretreatment of the substrate prior to formation of the carbonaceous coating and postreatment following drying of the carbonaceous coating prior to electroplating are omitted.

With reference to FIG. 2, there is shown treatment tank 100 containing carbonaceous dispersion 101. A continuous conveyor 102 racked with circuit board substrates 103 in a vertical position carries the substrates along a path into treatment tank 100 and into contact with carbon dispersion 101. As substrates 103 come into contact with the dispersion 101, they become coated with the dispersion and cling to the substrate as the substrate passes out of treatment tank 100. Where the openings in the substrates are of small dimension and the particles within the carbonaceous coating may be of large diameter, especially if aggregates form in the dispersion, there is a tendency for water and aggregates to become entrapped within the openings thus preventing full plating of the openings during the electroplating steps.

As substrates 103 pass from treatment tank 100, they are pivoted to a horizontal position using devices known to the art such as that disclosed in U.S. Pat. No. 4,783,244 incorporated herein by reference. When substrates 103 are pivoted into a horizontal plane, they are then transported by conventional means such as by the use of transport rollers 104 provided with a drive mechanism and gripping means at the sides (not shown) along a horizontal path. Downstream from treatment tank 100, substrates 103 pass between rollers 105. Rollers 105 are made from a deformable (elastic) material and are spaced apart from each other whereby they deform when substrate 103 enters into the nip of the rollers and continues between the rollers. Preferably, the rollers are in light contact with each other before contact with the substrates whereby they deform by at least the full thickness of the substrates as they pass between the rollers. The ability to deform and then return to their original configuration enables rollers 105 to remove fluid from holes passing through substrate 103 by suction created as the deformed rollers expand. The suction removes liquid and aggregates that might otherwise become trapped within the openings. Though one roller pair is illustrated in the drawings, it should be obvious to those skilled in the art that multiple deformable roller pairs may be used if desired.

Air blowers 106 are positioned downstream from roller pairs 105. Two blowers are illustrated in the drawing, one above and one below the path of the substrates. The number of air blowers and their location are not critical. The blowers direct a stream of air at substrates 103 as the substrates pass over or under the blower. The air stream removes residual water and particles entrapped in the openings within the substrate. The blowers are preferably in the form of an air knife transversing the full width of the substrates and having a narrow opening whereby air is directed through all of the openings within the substrate. Air preferably passes through the blowers at a volume of from 100 to 1,000 cubic feet per minute (CFM) and more preferably, at a volume of from 250 to 500 CFM. It is desirable that the air stream be maintained cool, preferably at room temperature and more preferably, at a temperature below 120° F. Otherwise, particles entrapped within the openings may be fixed to the wall of the opening making removal of the same more difficult. The air knife may be placed directly above and below the substrates, preferably at a distance of from 1 to 6" from the surface of the substrates.

Following passage of air through the openings in the substrate, the substrates 103 are desirably passed through drying oven 107. The drying oven is maintained at a temperature of from about 100° F. to about 300° F. The path through the drying oven is of sufficient length to remove essentially all moisture from the coating. It should be understood that this step differs from the conventional step of fixing as most of the water has been removed from the coating prior to the drying step.

Following drying, the carbonaceous coating is removed from metallic copper surfaces in accordance with the invention. Removal is facilitated if the dispersion contains an etchant by simultaneous etching of copper with the dispersion during the formation of the particulate coating. The remaining carbonaceous coating is removed from the copper surfaces by passing substrates 103 into chamber 108 filled with etchant 109. The dwell time in chamber 108 is that time sufficient to saturate the carbonaceous coating with the etchant. Typically, from 30 seconds to 2 minutes is adequate. Dwell time can be adjusted in the embodiment shown by providing a suitably long chamber 108. As substrates 103 emerge from chamber 108, they are contacted by a liquid spray from spray bars 110, desirably located above and below the substrates and offset from each other. The liquid sprayed onto substrates 103 may be water but is more desirably an etchant for the copper. Spray bars 110 desirably perpendicularly transverse the direction of movement of substrates 103 for the full width of said substrates. Spray is desirably projected onto substrates 103 from the spray bars within a narrow spray angle preferably an angle of 15° or less. The spray is projected onto the substrates at a pressure of at least 15 pounds per square inch (psi) and preferably, within a range of 20 psi to 50 psi.

By the time that the substrates 103 reach and pass through the spray, the etchant contained within the pores of the carbonaceous coating has undercut the copper thus loosening the carbonaceous coating from the surface of the copper. Preferably, the etchant has penetrated the into the surface to a depth of 20 to 60 microns. The spray acts to lift the carbonaceous coating from the copper. The high pressure of the spray causes turbulent flow of spray through the holes passing through the substrate thus removing any large aggregates of carbonaceous coating within the holes. The etchant used is desirably an oxygen based etchant as described above. Sodium persulfate, hydrogen peroxide mixed etchants are preferred. Other suitable oxygen based etchants include sodium peroxymonosulfate, sulfuric acid mixtures and hydrogen peroxide, sulfuric acid mixtures.

Following formation of the carbonaceous coating and removal of the same from copper surfaces, the part is ready for electroplating. The electroplating procedure is conventional. The substrates 103 are reracked in a vertical position, preferably using automatic racking means, and passed to plating tank 111 containing plating solution 112. The substrate to be plated is used as a cathode in a conventional electroplating cell. Current density is conventional and varies typically within a range of from 10 through 40 amps/ft.$^2$. In practice, it is convenient to initiate the current as the part enters the plating solution. A preferred current density range is from 15 to 30 amps/ft.$^2$. The plating solution is maintained at a temperature ranging between room temperature and about 100° F. Plating is continued for a time sufficient to form a deposit of desired thickness. For circuit board manufacture, a desired thickness may range between 0.5 and 2.0 mils, typically from 1 to 1.5 mils. A plating time of from 15 to 90 minutes would typically be required to obtain a deposit of the preferred thickness within the preferred range of current densities. The deposit formed by the process is uniform in thickness, free of defects and strongly bonded to the surface of the nonconductor over which it is plated. Bond strength is satisfactory to withstand solder shock testing as conventionally used in printed circuit board manufacture.

The resilient rollers (105 in FIG. 2) are made of a porous material or are coated with a porous material and are desirably foamed so as to be able to adsorb water. Typical plastic foams known to the art such as foamed polyvinyl alcohol and polybutadiene are suitable. As aforesaid, the use of a resilient or deformable roller results in suctioning of liquid from the openings transversing the substrate. The use of a foamed roller enhances the suctioning of the water from the openings and provides storage for the water removed.

EXAMPLE 1

A dispersion is prepared by providing a preformed graphite dispersion obtained from Acheson Chemical Company and identified as AQUADAG E. This dispersion contains about 3.0 percent by weight particulate graphite having a mean particle size of about 1 micron. The pH of the dispersion is adjusted to 10.5 by addition of ammonium hydroxide which functions both as an etchant for copper and as a pH adjustor. The dispersion is free of a dispersing agent.

EXAMPLE 2

The following example illustrates the manner in which a printed circuit board substrate may be electroplated in accordance with the procedures of this invention. All proprietary chemicals identified in the example are available from Shipley Company, L.L.C. of Marlborough, Mass.

A multilayer circuit board having 4 circuit layers with an array of 14 and 36 mil. holes may be subjected to the following procedure.

Step 1 Pre-clean and condition:
a. immerse in a proprietary organic solvent identified as MLB 211 at 160° F. for 5 minutes and water rinse;
b. desmear the hole walls with a proprietary permanganate solution identified as MLB 213 Promoter at a temperature of 180° F. for 6 minutes and water rinse;
c. neutralize acid residues by treatment with a proprietary alkaline solution identified as NEUTRALIZER 218-1 at room temperature for 3 minutes and water rinse;
d. condition the hole walls using a proprietary quaternary amine polyelectrolyte solution identified as XP-9503 at a temperature of 105° F. for 5 minutes and water rinse.

Step 2 Form conductive particle coating:
a. provide a treatment tank having a capacity of 135 liters filled with the dispersion of Example 1, a high density polyvinyl chloride tubing loop with a feed from the bottom of the tank and a return to the top of the tank and containing a shear mill identified as a Premier Colloid Mill pump having a 2" Invar rotor and a stainless steel stator with a silicon carbide insert spaced 0.020 inches from the rotor, and a filter assembly having a 200 micron filter downstream from the shear pump;
b. activate the shear pump and adjust the flow rate to 10 tank volumes per hour and pass the substrates through the dispersion within the treatment tank over a dwell time of 5 minutes at room temperature;
c. dry the coating on the substrate by passing the substrate between opposing 2 inch steel rollers coated with a one-half inch thick porous polyvinyl alcohol layer which are in light contact with each other prior to the substrate passing therebetween. The substrates are continuously passed between the rollers at a speed of about 260 feet per minute. Thereafter, the substrates are passed beneath an air knife having a length of 28 inches. The air knife is displaced about one-quarter inch beneath the substrate surface. Air is passed through the air knife at room temperature. The final step in the drying process comprising passing the substrates through an air circulating oven maintained at a temperature sufficient to heat the substrate surface to 140° F. during the time the substrates are in the oven.

Step 3 Microetch copper surfaces and remove dispersion coating from copper cladding.

Pass the board through an elongated chamber filled with aqueous etchant of 100 grams per liter of sodium persulfate and 50 ml per liter of sulfuric acid for a total dwell time of one half minute. Thereafter, spray the board with water at a pressure of about 30 psi using a spray bar with a fan nozzle of 15°. Inspection of the copper cladding will reveal that the dispersion coating has been removed from the surface leaving a clean copper surface available for metal plating.

Step 4 Electroplate:

Electroplate copper from an acid copper electroplating bath identified as ELECTROPOSIT® 1100 acid copper at a current density of 20 amps./ft.$^2$ and at a temperature of 70° F. for 1 hour and water rinse to obtain a deposit having a thickness of about 1.5 mils.

EXAMPLE 3

This example represents the preferred embodiment of the invention. Repeat the procedure of Example 2 using sodium persulfate sulfuric acid etchant as the spray in place of water in Step 3. The results obtained are similar to those of Example 2 though the copper has a slightly cleaner matte surface.

We claim:

1. A process for depositing metal on the walls of openings passing through a metal clad non-metallic planar substrate having top and bottom planar surfaces, said process comprising the steps of providing a dispersion of carbonaceous particles in an aqueous medium within a treatment container, contacting said substrate having said openings with said dispersion to form a porous coating of said carbonaceous dispersion over the planar surfaces of said substrate and on said metal cladding over the substrate, saturating said porous carbonaceous coating with an etchant for the metal cladding on said planar substrate and maintaining contact between the etchant and the metal cladding for a period of time of at least 30 seconds, removing said carbonaceous coating from the metal cladding by contact of the carbonaceous coating with a liquid spray under a pressure of from 15 to 50 pounds per square inch, and electroplating metal on at least those portions of said substrate coated with said carbonaceous coating from an electrolytic metal plating solution.

2. The process of claim 1 where the carbonaceous coating is graphite.

3. The process of claim 1 where contact time between the etchant and the metal cladding varies from about 1 to 10 minutes.

4. The process of claim 1 where the liquid spray is water.

5. The process of claim 1 where the liquid spray is the etchant for the metal cladding.

6. The process of claim 5 where the etchant is an amine based etchant.

7. The process of claim 6 where the etchant is ammonium hydroxide.

8. The process of claim 1 where the liquid spray transverses the full width of the substrate.

9. The process of claim 8 where the liquid spray contacts the carbonaceous coating at an angle that does not exceed 15 degrees.

10. A process for depositing metal on a copper clad printed circuit board base material having through-hole openings and top and bottom planar surfaces, said process comprising the steps of providing a dispersion of carbonaceous particles in an aqueous medium within a treatment container, contacting said copper clad circuit board base material with said dispersion to form a porous coating of said carbonaceous dispersion over the surfaces of said circuit board base material including the copper metal cladding, saturating said porous carbonaceous coating with a copper etchant and maintaining contact between the etchant and the copper cladding for a period of time of at least 30 seconds, removing the carbonaceous coating from the copper cladding by contact of the carbonaceous coating with a liquid spray at a spray pressure of from 20 to 50 pounds per square inch and electroplating metal on at least those portions of said circuit board base material coated with said carbonaceous coating from an electrolytic metal plating solution.

11. The process of claim 10 where the etchant is contained within the porous carbonaceous coating in contact with the copper cladding for a period of time of from about 1 to 10 minutes before the carbonaceous coating is removed therefrom.

12. The process of claim 10 where the spray used to remove the carbonaceous coating is an etchant and the spray pressure is at least 30 pounds per square inch.

13. The process of claim 10 where the etchant is an amine based etching.

14. The process of claim 13 where the etchant is ammonium hydroxide.

* * * * *